United States Patent [19]

Chen et al.

[11] Patent Number: 4,886,765

[45] Date of Patent: Dec. 12, 1989

[54] METHOD OF MAKING SILICIDES BY HEATING IN OXYGEN TO REMOVE CONTAMINATION

[75] Inventors: Min-Liang Chen, Lower Macungie Township; Chung W. Leung, South Whitehall Township; Chih-Yuan Lu, Lower Macungie Township; Nun-Sian Tsai, South Whitehall Township, all of Pa.

[73] Assignee: American Telephone and Telegraph Company, AT&T Bell Laboratories, Murray Hill, N.J.

[21] Appl. No.: 262,773

[22] Filed: Oct. 26, 1988

[51] Int. Cl.⁴ ............... H01L 21/283; H01L 21/316
[52] U.S. Cl. .................................. 437/200; 437/11; 437/24; 437/178; 437/239; 437/56; 437/946; 437/41; 437/44; 148/DIG. 17; 148/DIG. 19
[58] Field of Search ............... 437/40, 41, 44, 178, 437/179, 192, 200, 201, 946, 56, 10, 11, 12, 24, 239; 148/DIG. 17, DIG. 19, DIG. 20, DIG. 71, DIG. 138, DIG. 147; 357/67, 71

[56] References Cited

U.S. PATENT DOCUMENTS

| | | | |
|---|---|---|---|
| 3,620,850 | 11/1971 | Deap | 437/941 |
| 3,983,264 | 9/1976 | Schroen et al. | 437/946 |
| 4,378,628 | 4/1983 | Levinstein et al. | 437/12 |
| 4,484,979 | 11/1984 | Stocker | 156/643 |
| 4,585,517 | 4/1986 | Stemple | 437/946 |
| 4,622,735 | 1/1986 | Shibata | 437/200 |

FOREIGN PATENT DOCUMENTS

| | | | |
|---|---|---|---|
| 0074441 | 4/1985 | Japan | 148/DIG. 3 |
| 0097824 | 5/1986 | Japan | 437/946 |

OTHER PUBLICATIONS

SZE, SM., *VLSI Technology*, 1983, McGraw Hill, pp. 140–143, 242–251.

English Translation of Japan Pat. No. 60-7441, (1985), "Surface Treatment of Semiconductor Layer," M. Tajima.

*Primary Examiner*—Brian E. Hearn
*Assistant Examiner*—T. N. Quach
*Attorney, Agent, or Firm*—J. H. Fox

[57] ABSTRACT

Silicides are important for submicron VLSIC technology. Problems have been found in forming silicides by known techniques involving simply depositing a metal film and heating that metal to form a silicide layer. This invention solves the problems through recognition that polymeric contamination can be left on the surface from commonly-used previous reactive ion etch steps, and removes any such contamination to metal deposition by the additional step of heating in dry oxygen at a low temperature, such as 800 degrees Centigrade, before the contamination has been significantly hardened.

10 Claims, 1 Drawing Sheet

METHOD OF MAKING SILICIDES BY HEATING IN OXYGEN TO REMOVE CONTAMINATION

TECHNICAL FIELD

This invention relates to an improved method of forming semiconductor integrated circuit devices and, more particularly, to an improved method of forming silicides as a part of such devices.

BACKGROUND OF THE INVENTION

In fabricating semiconductor integrated circuits, it has become conventional to first form one of a great variety of insulative, semiconductive, or conductive layers and then selectively remove portions of such layer to produce a desired pattern. As the art has progressed to the use of ever-smaller dimensions, various forms of plasma etching, such as, for example, reactive ion etching, sometimes termed "reactive sputter etching," have been increasingly used.

More specifically, in the field of silicon-based Very Large Scale Integrated Circuits ("VLSICs"), various similar forms of a Complementary Metal Oxide Semiconductor ("CMOS") technology are widely used. In CMOS integrated circuit devices, electrical contact to source, drain and gate regions of individual devices contained therewithin often is facilitated by first selectively removing, by reactive ion etching, those portions of layers overlying such regions to expose surface portions of such regions and then forming a metal silicide layer at the exposed surface of each such region. As is well known, a metal silicide typically is formed by depositing a metal film, such as titanium, in contact with a silicon surface and then heating the body to an elevated temperature to create a compound, e.g., titanium silicide, which advantageously is stable, physically adherent and effective in producing a low resistance connection to the desired region.

Problems are often encountered in reliably and reproducibly forming the many hundreds of thousands of silicide layers which typically are required on each CMOS VLSIC. Such problems are often manifested in obviously incomplete reaction of the metal with the silicon to form a silicide, blistering and peeling which are evident by visual inspection immediately after heating, and less obvious, but unacceptably poor adhesion, which may not be evident until reliability testing after device fabrication has been completed. Still another problem is that an excessively high electrical resistance will be found by later electrical analysis, even though the silicide layer appeared visually to be acceptable after the heating step.

Heretofore, when such problems were encountered, workers in the art have tended to attempt to verify that the cleaning step(s) preceding the metal deposition step and the metal deposition step itself had been performed correctly. Often no understanding was gained as to the cause for intermittent failure to form one or more acceptable silicide layers on an otherwise wholly acceptable device.

SUMMARY OF THE INVENTION

Through various forms of analysis, including Auger spectrum analysis, the inventors herein have found that steps typically performed previous to depositing the metal film can leave various forms of invisible, often polymeric, contamination, including mixtures of fluorine, carbon and oxygen, on the surface of the device and that effective removal of such contamination produces demonstrably improved silicide formation.

More specifically, as one embodiment of this invention, an improved method of forming silicides involves performing an additional step of heating the body in essentially only oxygen, e.g., dry oxygen, at a relatively low temperature, e.g., 800 degrees C., to remove contamination, preferably as soon as feasible after a selective etch step and prior to a step of depositing a metal film from which a silicide is to be formed. Introduction of a small percentage, e.g., 2%, of oxygen into a subsequent higher temperature heating step, such as an ion implantation annealing step which is normally done anyway, e.g. at 950 degrees C., prior to the metal deposition step is also recommended, but not required in accordance with this invention, to ensure more complete removal of any contamination prior to the metal deposition.

Alternatively, as another embodiment of this invention, especially adapted for submicron technologies where an additional heating step can be a problem, the surface of a body on which silicide layers are to be formed is first subjected to a moderate amount of backsputtering in an inert gas, e.g., argon. The backsputtering can be performed in a reactive ion etch chamber promptly after a selective etching step, or alternatively may be performed in a separate sputtering apparatus, preferably before any further processing (after selective etching) of a type which could tend to significantly harden any polymeric or other contamination.

In methods where the heating can be tolerated, both the backsputtering and heating in dry oxygen can be used to advantage. In this case, the additional step of heating in dry oxygen serves to provide additional opportunity for removal of residual contaminants, as well as to release any inert gas atoms which may have become trapped in the surface during the backsputtering operation.

In still another embodiment of this invention, a conventional oxygen plasma treatment, such as is commonly used, for example, to strip photoresist can be used to remove the contamination to which this invention is directed. If the use of such a plasma is elected, it is especially important to perform this step to remove the contamination as soon as feasible after a reactive ion etch step and before any further processing of a type which could significantly harden any polymeric or other contamination is performed.

BRIEF DESCRIPTION OF THE DRAWING

The above-described and other features of this invention, as well as the invention itself, will be more fully understood from the following detailed description of the drawing, in which.

Figure 1:
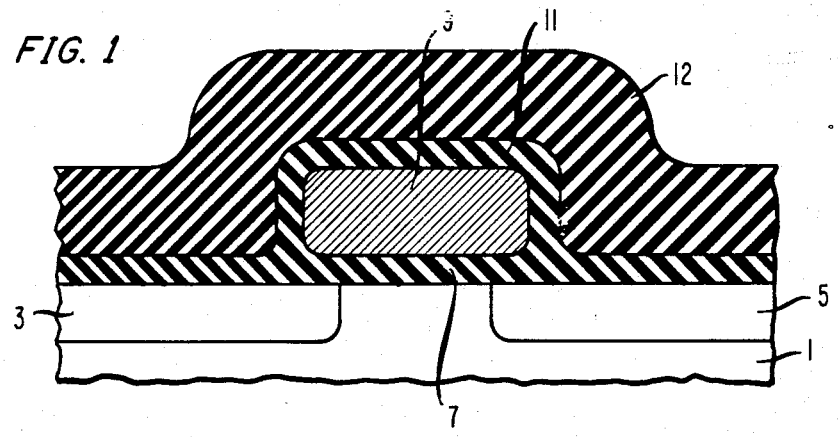
FIGS. 1-4 are somewhat schematic sectional views showing a typical device at selected stages of fabrication before and after the practice of an illustrative embodiment of this invention.

It will be appreciated that for simplicity and clarity of explanation the figures have not necessarily been drawn to scale. Further, where considered appropriate, reference numerals have been repeated among the figures to indicate corresponding features.

DETAILED DESCRIPTION

With reference now to the drawing, FIG. 1 depicts a small portion of a silicon body 1 having source and drain regions 3 and 5, respectively, gate oxide 7 and polysilicon gate 9. As will be described in more detail below, the source and drain regions typically are formed by ion implantation into the body in accordance with procedures well known in the art. The silicon body in which the devices are formed is typically a silicon wafer, which may, but need not, have an epitaxial layer formed thereon. Either form of body is considered a "substrate" for the purposes of this invention. Details of the various processing sequences typically employed to fabricate the structure depicted are well known in the art and, accordingly, need not be described in further detail.

Polysilicon gate 9 is formed by depositing a layer of polysilicon, for example to a thickness of about 450 nanometers ("nm"), diffusing or ion implanting phosphorous or other dopants into the layer at a temperature of about 900 degrees C. for a time and at a concentration to achieve a sheet resistance of about 50-100 ohms per square, and then using known lithographic techniques, including photoresist and reactive ion etching, to produce the gate 9 depicted. After gate 9 is formed, the resulting structure advantageously is cleaned in a solution of hydrofluoric acid ("HF") and water, for example, at a concentration of 100 parts of water to 1 part of HF, prior to further processing.

As is well known for contemporary VLSIC technologies, i.e., in the one micrometer ("micron") and submicron range, polysilicon gate 9 is used as a self-aligned mask to enable selective ion implantation of dopants to form the lightly doped portion of source and drain regions 3 and 5, respectively. As is also well known in the art and as is taught in more detail by M. L. Chen et al. in IEDM Technical Digest, December, 1986, pp. 256-259, contemporary CMOS technologies typically employ what is termed a "Lightly Doped Drain" ("LDD") structure, wherein source and drain regions each have both a lightly doped portion adjacent to the gate and a heavily doped portion elsewhere, to reduce deleterious effects of "hot carriers" in physically small devices.

Layer 11 is a thermally grown oxide, typically about 15-60 nanometers in thickness, formed for a primary purpose of rounding the lower edges of polysilicon gate 9 to reduce oxide stresses and thereby to improve the breakdown strength of such oxide portions under electric fields. As is taught in more detail in the copending application (M. L. Chen-C. W. Leung 4-4), Serial No. 221,817, Filed 7/20,88, and commonly assigned with this application, such a layer 11 may be formed by heating the body at 900 degrees C. in a dry oxygen ambient for about 20 minutes. The thermal oxidation step to form layer 11 is also advantageous in that the heating step associated therewith simultaneously drives the lightly doped portions of source and drain 3 and 5 an appropriate amount, typically about 300 to 600 nanometers, into the substrate.

Over layer 11, an oxide layer 12, for example TEOS, is deposited to a thickness of about 400 nanometers for contemporary devices of about 0.8 micron nominal lithography rules. As is known in the art, the term "TEOS" is commonly used for oxides formed by deposition in an environment wherein tetraethoxysilane is flowed over a heated deposition substrate, thus causing pyrolysis of the tetraethoxysilane with the resultant formation of a silicon oxide upon the deposition substrate. Hereinafter, as is commonly understood by those in the art, the term "TEOS" will be taken to include any appropriate TEOS layer, whether or not doped with other elements.

Figure 2:
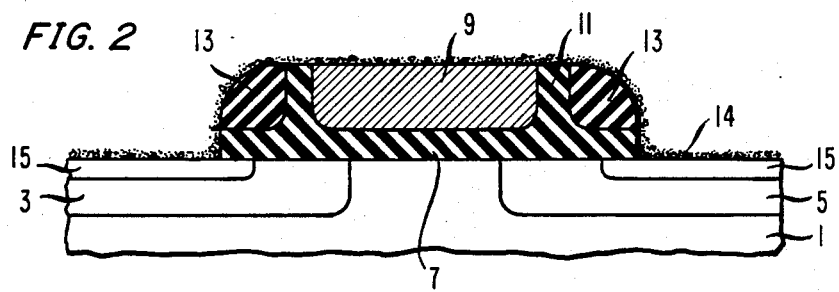

Most of TEOS layer 12 is anisotropically removed by well known reactive ion etching procedures to leave portions 13 (FIGS. 2-4) to serve as what are commonly termed "sidewall" spacers. Also removed in that step are the horizontal portions of oxide to the left and right of spacers 13. As is taught in more detail in the aforementioned paper by Chen et al., the spacers are formed and used primarily to horizontally enlarge the ion implantation mask previously comprised of polysilicon gate 9 and oxide layer 11 thereover, thereby to permit a subsequent, self-aligned ion implantation of dopants spaced within the perimeters of the initially relatively lightly doped portions of regions 3 and 5 to form the more heavily doped portions 15 (FIGS. 2-4) of source and drain regions 3 and 5. As will now be appreciated more graphically, those portions which have heretofore been referred to as "the lightly doped portions" of source and drain 3 and 5 are the portions of regions 3 and 5 outside of portions 15.

Although reactive ion etching is well known in the art, it will be understood hereinbelow that the reactive ion etching step is thought to be an important contributor to a problem which the present invention solves, and so the reactive ion etching step typically used to etch the TEOS layer 12 will now be described in some detail. Briefly, in contemporary 0.6 micron and 0.8 micron twin-tub CMOS technologies, mixtures of Freon 23 ($CHF_3$, trifluoromethane) and oxygen, as well as mixtures of $CHF_3$ and carbon dioxide ($CO_2$) have been used. In a typical process, a reactive ion etch chamber is first loaded with wafers to be etched and then evacuated to a pressure below $5 \times 10^{-4}$ torr. Thereafter a combination of $CHF_3$, at a flow rate of about 60 sccm, and $O_2$, at a flow rate of about 6.8 sccm, (or a combination of $CHF_3$, at a flow rate of about 60 sccm, and $CO_2$, at a flow rate of about 6.8 sccm) is introduced into the chamber, and the pressure is adjusted and controlled at about 65 millitorr. RF power is then applied to the cathode of the chamber and is adjusted to achieve about 520 volts of negative self-bias of the wafer relative to the plasma. Typical etch rates experienced with either mixture are about 45 nm/min. for silicon dioxide, 80 nm/min. for P-glass, and 20-30 nm/min. for TEOS. With the $CHF_3/CO_2$ mixture, greater selectivity with respect to silicon is achieved, i.e., the $CHF_3/CO_2$ mixture etches silicon at about one-half the rate of the $CHF_3/O_2$ mixture. After sufficient etching has been performed, the RF power is turned off; the chamber is vented with nitrogen; the chamber is opened and the wafers are removed.

Figure 3:
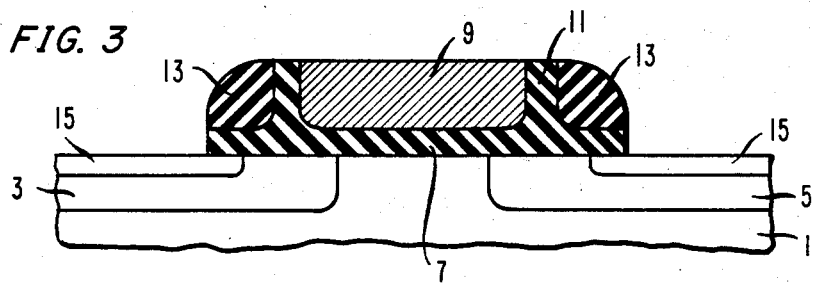
Figure 4:
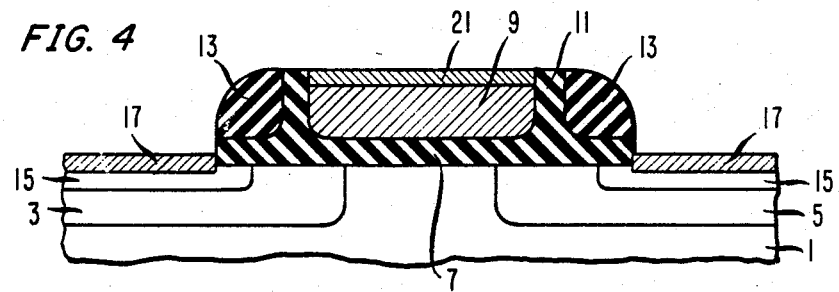

Assuming that all has gone well with the etch, the dielectric pattern, including features 7, 11 and 13 of FIG. 3, has been formed, and then highly doped portions 15 of source and drain regions 3 and 5 are formed by the aforementioned self-aligned ion implantation of a heavier dose, typically of the same type dopants used previously to form the more lightly doped portions of regions 3 and 5, selectively into portions of the surface of the substrate. Thereafter, all remaining photoresist is stripped, using a conventional oxygen plasma resist strip process, or a solution ("sulf/perox") consisting of a 10-to-1 mixture of sulfuric acid and hydrogen peroxide, respectively, or a combination of both the plasma strip and the sulfur/perox. Following the strip, the wafers are cleaned in a solution of 5-to-1 sulf/perox, and then annealed in an ambient of nitrogen and 2% oxygen at about 950 degrees C. for about 30 minutes. This annealing step is heretofore known to simultaneously: (1) drive the source and drain regions to an appropriate depth; (2) set the electrical channel lengths and (3) anneal ion implantation damage.

After the annealing step, the wafers are again cleaned in a solution of 5-to-1 sulf/perox and then etched in a solution of 15-to-1 parts of water and hydrofluoric acid, respectively. Thereafter, a metal, such as titanium, is deposited upon the surface of the wafer to a nominal thickness of about 100 nanometers and a sheet resistivity of about 5-8 ohms per square. Then the wafers are implanted with silicon at an energy of about 110 Kev and a dose of about $1 \times 10^{15}$ to achieve a sheet resistivity of about 6-9 ohms per square. This implantation step produces what is commonly termed in the art "ion beam mixing," which is known to intermix the interface between the titanium and the polysilicon over the exposed portions of polysilicon gate 9 and between the titanium and the exposed portions of silicon at the exposed surface portions of the more highly doped portions 15 of source and drain regions 3 and 5, all of which exposed silicon and polysilicon is known to have a practically unavoidable native oxide thereon, and thereby improves the formation and adhesion of the soon-to-be-formed titanium silicide.

After the implantation, the wafers are subjected to a first RTA (Rapid Thermal Anneal) step at a temperature of about 600 degrees C. (as measured by a thermocouple attached to the wafer or by other well known techniques such as with the use of a pyrometer) in a nitrogen ambient for about 60 seconds to form $TiSi_x$, with a sheet resistivity of about 4-11 ohms per square. Following this first RTA step, the wafers are etched in a solution consisting of water, hydrogen peroxide and phosphoric acid, in approximately the following proportions: about 5600 ml. water; 4200 ml. hydrogen peroxide, and 2800 ml. phosphoric acid, at a nominal solution temperature of about 80 degrees C. for approximately 9 minutes to remove any titanium-nitride formed during the RTA and any unreacted titanium left after the RTA. Following this etch, the wafers are again subject to RTA, at a temperature of about 900 degrees C. for about 20 seconds, to complete the formation of the desired silicide layers, i.e., $TiSi_2$, having a sheet resistivity of about 1-3 ohms per square, and depicted in FIG. 4 as layers 17 at the exposed surface portions of the relatively highly doped portions 15 of the source and drain regions 3 and 5, respectively, and zone 21 at the exposed surface portion of polysilicon gate 9.

Unfortunately, as has been described hereinabove in the "BACKGROUND OF THE INVENTION," a satisfactory metal silicide layer is not always produced. Poor adhesion of an otherwise apparently good silicide layer, obviously incomplete reaction of the metal film with the silicon to form a silicide layer, blistering, peeling, unacceptably high electrical contact resistance, and unacceptable lifetime reliability are just some of the ways workers in the art have experienced this problem.

Fortunately, through various extensive forms of analysis, including but not limited to Auger spectrum analysis, the inventors herein have found and recognized that, even after all of the cleaning and etching steps described hereinabove, various heretofore unrecognized forms of contamination, usually polymeric in nature, can be left on the surface of the wafers at the stage just prior to the deposition of the metal film which is intended to form the metal silicide layer. This contamination is depicted graphically in FIG. 2 as "dirt" particles 14. Of course, it will be appreciated that this contamination is typically extremely thin (of the order of monolayers) and usually invisible (even under a normal microscope), and is shown as obvious dirt in FIG. 2 solely for purposes of graphic illustration. Auger spectrum analysis has indicated this contamination is typically polymeric in nature and usually contains primarily carbon, fluorine and oxygen; and it is for this reason that it is strongly suspected it is caused primarily by the reactive ion etching step described above in some detail.

In one embodiment of this invention, which has been introduced with significant advantage into a 0.8 micron twin-tub CMOS technology, this polymeric dirt is removed, and the problem is demonstrably solved in the form of highly reliable subsequent silicide layer formation, by a simple additional step of heating the wafers at a temperature of about 800 degrees C. for about 20 minutes in an ambient consisting essentially only of 100% dry oxygen subsequent to the above-described 5-to-1 sulf/perox cleaning step which follows the reactive ion etching step. Of course, the temperature need not be restricted to 800 degrees and the time need not be restricted to 20 minutes, but it is believed this combination is nearly optimum for a 0.8 micron technology to achieve adequate removal of contamination without unduly affecting other portions of the devices with too much heat.

It is important to perform this oxidation/contamination-removal step at this point in the overall process sequence to reduce the likelihood of any significant hardening of the polymeric contamination at any later step. Simply allowing the wafers to sit around at room temperature will not significantly harden the contamination, but any process step at an elevated temperature or any other step which subjects the wafer to high voltage or energy, such as an ion implantation step, can significantly harden the the contamination and thus interfere with, or prevents, its removal by the simple steps of the various embodiments of this invention.

It is also believed that the introduction of 2% oxygen in the ambient during the above-described anneal step at 950 degrees C., which just precedes the metal deposition step, also aids appreciably in ensuring more complete removal of any residual polymeric contamination which may have been left up to that time. In technologies with smaller dimensions, e.g., with 0.6 micron nominal lithographic rules, the annealing step may be performed at a lower temperature, e.g., 800-850 degrees C., and that also aids in ensuring more complete removal of any residual polymeric contamination.

In an alternative embodiment of this invention, recommended primarily but not necessarily for technologies such as those with 0.6 micron nominal lithographic rules or smaller, a backsputtering step in an inert atmosphere, such as pure argon, can be added to the process just after the reactive ion etch step, and while the wafers are still in the etch chamber. Alternatively, this backsputtering step can be performed in a separate apparatus, such as a sputter deposition apparatus, as soon as feasible after the wafers are etched, but in any event before the wafers are subjected to any type of subsequent processing of a type which could tend to significantly harden the contamination. More specifically, this new backsputtering step has been performed in a separate sputter deposition apparatus, identified as a Varian Model 3180, at a voltage of about 760 volts and at a sustained pressure of 10 millitorr of pure argon after the chamber had been first pumped down to about $3 \times 10^{-7}$ torr and then backfilled with pure argon. The backsputtering was performed at a power level of about 160 watts of RF power for about 2 minutes and, via test wafers, it was determined that with those parameters an equivalent rate of oxide removal was about 20 nanometers.

Along with this backsputtering step to remove the polymeric and other contamination, it is recommended that the additional step of oxidizing for about 20 minutes in dry oxygen at a temperature of about 800 degrees C. also be performed, if the devices being processed can tolerate the additional heating, as it not only serves to ensure more complete removal of the polymeric contamination, but also serves to release any argon atoms which may have been trapped in the surface of the wafer during the backsputtering operation.

In still another alternative embodiment of this invention, the contamination can be removed with a conventional oxygen plasma of the type commonly used to strip photoresist. In the practice of this embodiment, it is important to perform this oxygen plasma treatment before the contamination has been significantly hardened by further processing. For example, although the aforementioned oxygen plasma process has been conventionally used after the reactive ion etch step to strip the photoresist, it has been performed (and must be performed) after the ion implantation step described for forming highly doped portions 15, and is not effective at that time to remove the contamination because the contamination has by then been significantly hardened by the ion implantation step and therefore is not removed. To repeat, to remove the contamination left by the reactive ion etch step, the oxygen plasma treatment must be performed before the contamination is significantly hardened by subsequent processing.

Although the invention has been described in part by making detailed reference to certain specific embodiments, such detail is intended to be and will be understood to be instructive rather than restrictive. It will be appreciated by those in the art that many variations may be made in the structure and mode of operation without departing from the spirit and scope of the invention as disclosed in the teachings contained herein. For example, it should be apparent that the invention is not limited to use with technologies employing titanium silicide, but is equally efficacious with technologies employing any other refractory silicide, such as, without limitation, tantalum silicide, cobalt silicide and tungsten silicide, and with technologies which may employ self-aligned and/or non-self-aligned silicides.

We claim:

1. A method of fabricating a semiconductor integrated circuit device, including the step of selectively removing from a body those portions of a dielectric layer disposed over a silicon substrate to expose portions of the substrate, including those where source/drain regions are to be formed characterized in the steps of:
   performing the selective removal step in a manner which tends to leave contamination on at least one of the exposed portions of the substrate;
   treating the body by heating in an atmosphere consisting essentially only of oxygen for a time and at a temperature sufficient to remove substantially all of the contamination left after the selective removal step to permit reliable subsequent silicide formation;
   implanting a dopant into said substrate after said treating;
   heating the body a second time in an atmosphere comprising a minority percentage oxygen to drive in said dopant, anneal ion implant damage, and further remove contamination;
   etching off the silicon dioxide formed during said treating and heating steps; and
   forming a metal silicide at the exposed portions of the substrate by depositing upon the exposed silicon portions a refractory metal and heating the body for a time and at a temperature sufficient to form a metal silicide.

2. A method as recited in claim 1 wherein the step of heating in oxygen is conducted at a temperature of about 800 degrees C. for a time of about twenty minutes.

3. A method as recited in claim 1 wherein the second heating step is performed at a temperature between about 850 and about 950 degrees C., and the oxygen percentage is about two percent.

4. A method as recited in claim 1 wherein the treating step includes backsputtering at least the exposed portions of the substrate in an atmosphere consisting essentially only of an inert gas.

5. A method as recited in claim 1 comprising the additional step of subjecting at least the exposed silicon portions to backsputtering prior to the step of heating in oxygen at the first temperature.

6. A method as recited in claim 5 wherein the backsputtering step is performed in an atmosphere consisting essentially only of an inert gas.

7. A method as recited in either of claims 4 or 6 wherein the inert gas is argon.

8. A method as recited in claim 1 wherein the refractory metal is selected from the group consisting of titanium, tantalum, cobalt and tungsten.

9. A method as recited in claim 8 wherein the refractory metal is titanium.

10. A method of fabricating a CMOS semiconductor integrated circuit device including a plurality of source, drain and gate regions, including the steps of employing reactive ion etching in an atmosphere including materials selected from the group consisting of trifluoromethane, carbon dioxide and oxygen to selectively remove from a body including a silicon substrate those portions of a dielectric layer disposed over predetermined surface portions of the source, drain and gate regions to expose such surface portions through the remaining portions of the dielectric layer, characterized in the steps of:
   subjecting at least said exposed surface portions to backsputtering in an atmosphere consisting essentially only of pure argon before performing any further processing, after the reactive ion etch step, of a type which could tend to significantly harden any contaminatiion left by the reactive ion etch step;
   heating the body in an atmosphere consisting essentially only of oxygen at a temperature of about 800 degrees C. for a time of about twenty minutes to more completely remove any residual amounts of any of said contamination and to release any argon trapped in the surface of the substrate from the backsputtering step;
   additionally heating the body in an atmosphere including a minority percentage of oxygen at a temperature of at least about 800 degrees C. to more completely remove any further residual amounts of said contamination;

thereafter depositing a metal film on at least said exposed portions of the surface of the source, drain and gate regions; and heating the body to form a metal silicide at said exposed portions.

* * * * *